United States Patent [19]

Kutaragi et al.

[11] 4,183,025
[45] Jan. 8, 1980

[54] LEVEL INDICATING SYSTEM

[75] Inventors: Ken Kutaragi, Kawasaki; Masayoshi Nakamura, Tokyo, both of Japan

[73] Assignee: Sony Corporation, Tokyo, Japan

[21] Appl. No.: 885,262

[22] Filed: Mar. 10, 1978

[30] Foreign Application Priority Data

Mar. 18, 1977 [JP] Japan .................................. 52/30012

[51] Int. Cl.² ........................ G01R 19/16; G08B 5/36
[52] U.S. Cl. .................................. 324/103 P; 307/351; 340/722; 340/753
[58] Field of Search ............................ 324/103 P, 102; 307/351; 340/722, 753

[56] References Cited

U.S. PATENT DOCUMENTS 3,922,666  11/1975  Inami et al. ...................... 324/103 P Primary Examiner—Rudolph V. Rolinec
Assistant Examiner—Ernest F. Karlsen
Attorney, Agent, or Firm—Lewis H. Eslinger; Alvin Sinderbrand

[57] ABSTRACT

A level indicating apparatus indicates the peak level of an analog signal and also indicates the instantaneous value of the analog signal during a recurring time interval of predetermined length. The apparatus includes a circuit for generating, during each recurring time interval, a train of pulses whose number corresponds to the level of the analog signal, a storage device which may be a shift register for storing the train of pulses, a circuit for forming a pulse whose position corresponds to the peak level of the analog signal, a feedback circuit for feeding the pulse, whose position corresponds to the peak level, back to the storage device to be combined with the train of pulses corresponding to the instantaneous value of the analog signal, and a display for indicating the peak value. Preferably the display also indicates the instantaneous value of the analog signal. The circuit for forming the pulse whose position corresponds to the peak value can include a logic differentiation circuit.

9 Claims, 13 Drawing Figures

FIG. 3

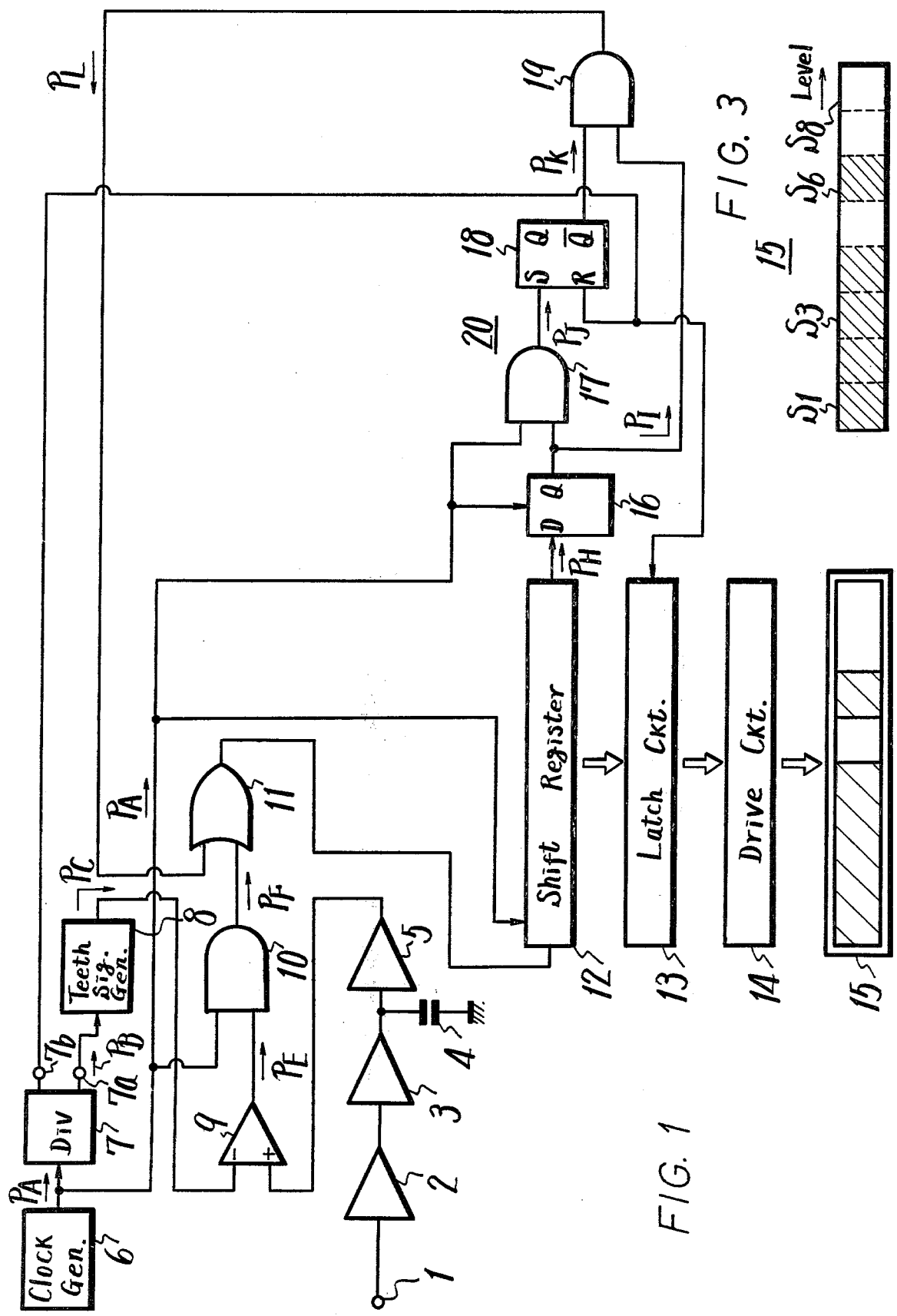

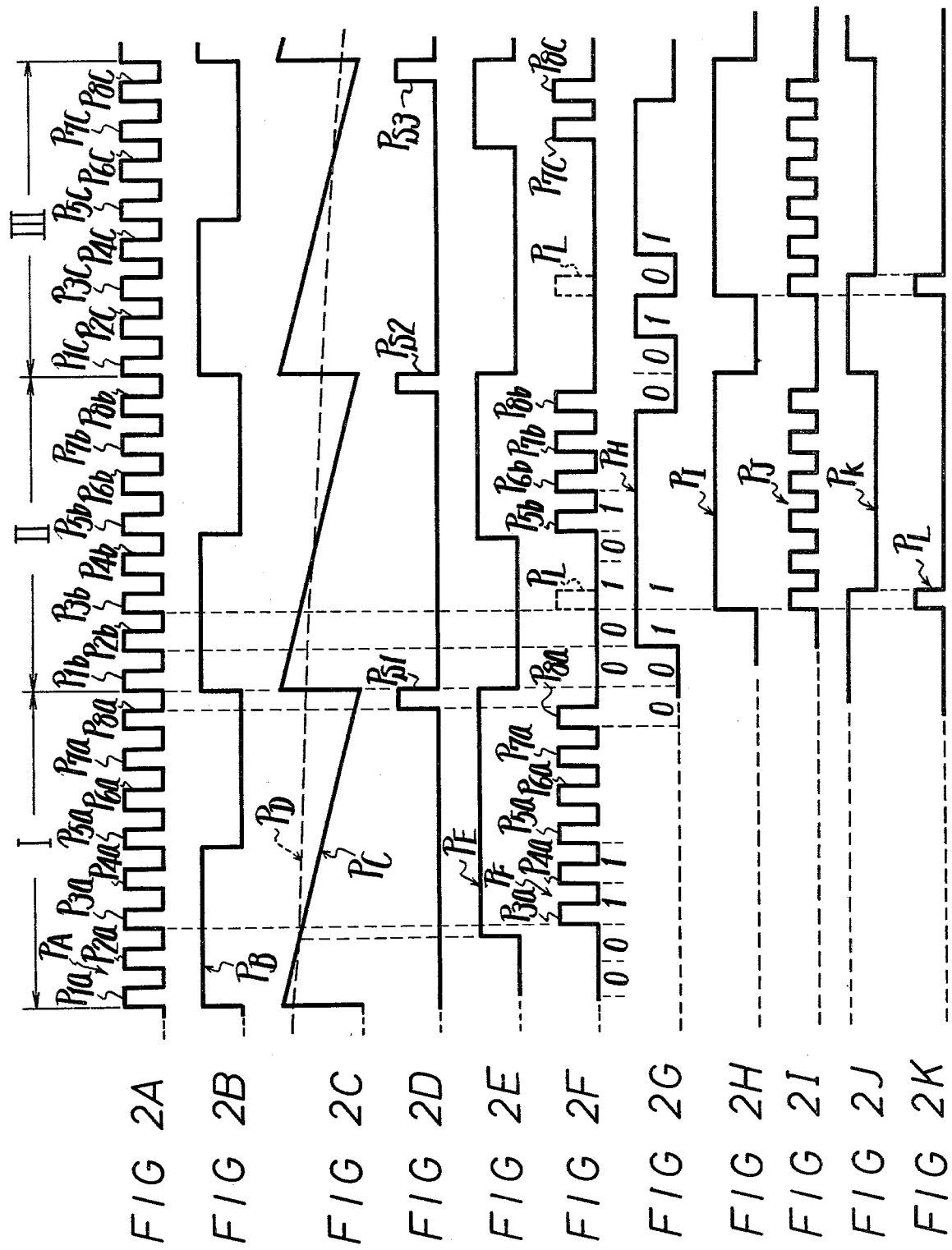

LEVEL INDICATING SYSTEM

BACKGROUND OF THE INVENTION

1. Field of the Invention

This invention relates generally to a level indicating system, and more particularly to a level indicating system which indicates the maximum peak level of a signal.

2. Description of the Prior Art

In the art, in order to set the recording level of a tape recorder or to determine the input tolerance of a speaker by detecting the maximum output of an amplifier, there has been proposed a peak hold circuit which will hold the maximum value of the peaks of an audio signal in an analog manner. Such a prior art peak hold circuit requires a peak hold capacitor of large capacitance so as to make the discharging time long. For such a peak hold capacitor of large capacitance, it is necessary to use a tantalum capacitor or the like. Further, in order to make the charging time short, a driver stage with an output impedance is required and in order to make the discharging time long it is necessary that the charging voltage for the capacitor be amplified by an FET having a high input impedance.

As a result, such a prior art circuit is complicated in construction as set forth above and not well suited to be made as an integrated circuit. Further, the capacitor can not be charged sufficiently by a short pulse even though the circuit is constructed as above, and hence a peak hold lower than a practical value is attained by the prior art peak hold circuit.

OBJECTS AND SUMMARY OF THE INVENTION

An object of the present invention is to provide a level indicating system which detects the peak level of an analog signal such as an audio signal and displays a representation of the same.

Another object of the present invention is to provide a level indicating system which digitally process an analog signal, detects its peak level and displays a representation of the same.

A further object of the invention is to provide a level indicating system in which a digital circuit such as a shift register or the like is used but the requirement for a capacitor of a large capacitance is avoided in order to simplify the circuit construction of the system.

A yet further object of the invention is to provide a level indicating system by which the real-time analog level of an analog signal and its maximum peak level are displayed simultaneously.

According to an aspect of the present invention, an apparatus for indicating the level of an analog signal subject to variations in amplitude comprises: first means for providing a train of pulses during a recurring time interval of predetermined period, with the number of pulses in the train corresponding to the level of the analog signal; second means, such as a shift register, for storing the train of pulses and providing an output corresponding to the stored train of pulses; third means for forming a pulse whose position corresponds to the peak level of the analog signal in any time interval prior to the present time interval; means for feeding the pulse formed in said third means back to the second means to be combined with the train of pulses provided by said first means; and a display device for displaying at least the peak level of the analog signal in response to the output from said second means. The foregoing third means can include a circuit for differentiating the output of the second means so as to provide a pulse only in response to the first differentiated output during one of the recurring time intervals, but inhibiting subsequent pulses during each such interval.

The other objects, features and advantages of the present invention will become apparent from the following description taken in conjunction with the accompanying drawings.

BRIEF DESCRIPTION OF THE DRAWINGS

FIG. 1 is a block diagram showing an example of the level indicating system according to the present invention;

FIGS. 2A to 2K are waveform diagrams of output signals obtained at the output sides of the various elements shown in FIG. 1 and used for explaining the system shown in FIG. 1; and FIG. 3 is a simple graph showing the indicating state of the indicating device shown in FIG. 1.

DESCRIPTION OF THE PREFERRED EMBODIMENT

An example of the level indicating system of the present invention will be hereinafter described with reference to the drawings.

In FIG. 1 which shows one example of the invention in block, an analog signal such as an audio signal is fed to an input terminal 1 and then through a logarithmic amplifier 2 to an envelope detector 3. The output signal from the envelope detector 3 is fed to a hold capacitor 4 which holds the peak level of the output signal from the detector 3 for, about 2 seconds and then the held peak level is fed to a peak value amplifier circuit 5. Here, the hold capacitor 4 serves to remove rapid variation components from the peak value. Meanwhile, a reference or clock pulse oscillator 6 produces a clock pulse $P_A$ which is shown in FIG. 2A. This clock pulse $P_A$ is fed to a frequency divider circuit 7 which divides the clock pulse frequency by eight, producing the signal $P_B$ shown in FIG. 2B.

In this case, for the convenience of explanation, one time interval or period equal to eight clock-pulse period is taken as a unit time or period for the peak indication (which will be hereinafter referred to as a unit time or period). Eight of the clock pulses $P_A$ in the unit time or period I are taken as $P_{1a}, \ldots P_{8a}$, eight of the clock pulses $P_A$ in the unit time or period II as $P_{1b} \ldots P_{8b}$ and eight of the clock pulses $P_A$ in the unit time or period III as $P_{1c} \ldots P_{8c}$, respectively. In this manner, eight clock pulses make up the unit time or period, and an input analog signal is converted into a pulse at every unit time so that the real-time instantaneous peak value of the analog signal is displayed or indicated only during the unit time or period.

The frequency divider 7 produces at one output terminal 7a the pulse $P_B$ which rises up at the positive-going edges of pulses $P_{1a}$, $P_{1b}$ and $P_{1c}$ shown in FIG. 2A. The pulse $P_B$ derived from ⅛ frequency divider 7 is fed to a sawtooth signal generator 8 which then produces a sawtooth wave signal $P_C$ which also rises up at the positive-going edges of clock pulses $P_{1a}$, $P_{1b}$ and $P_{1c}$ and thereafter drops down with a predetermined inclination as shown in FIG. 2C. This sawtooth wave signal $P_C$ from the sawtooth wave signal generator 8 is fed to the inverse input terminal of a comparator circuit 9. The ⅛ frequency divider 7 produces at its other output terminal 7b strobe pulses $P_{S1}$, $P_{S2}$ and $P_{S3}$ which rise up at the negative-going edges of clock pulses $P_{8a}$, $P_{8b}$ and $P_{8c}$, respectively, as shown in FIG. 2D.

The comparator circuit 9 is supplied at its non-inverse input terminal with an output signal $P_D$ from the peak value amplifier circuit 5. The level of the output signal $P_D$ from the peak value amplifier circuit 5 is shown in FIG. 2C by the dotted line. As long as the level of output $P_D$ from the peak value amplifier circuit 5 is higher than the level of sawtooth wave signal $P_C$ in FIG. 2C, the comparator circuit 9 produces an output signal $P_E$ which is "1" as shown in FIG. 2E. The output signal $P_E$ from the comparator circuit 9 and the clock pulse $P_A$ from the clock pulse generator 6 are both applied to an AND gate 10, so that the AND gate 10 passes therethrough the clock pulse $P_A$ during the period in which the output $P_E$ from the comparator circuit 9 is "1". Therefore, in the case of the unit time period I, the clock pulses $P_{3a}, \ldots P_{8a}$ of the clock pulse $P_A$ pass through the AND gate 10, as shown in FIG. 2F, as the output $P_F$ of AND gate 10. Thus, the signal $P_F$ is the logic product of signals $P_A$ and $P_E$. Accordingly, it can be seen that the input analog signal is converted serially to pulses whose number corresponds to the level of the input analog signal. Similarly, in the case of the unit time period II, the clock pulses $P_{5b}, \ldots P_{8b}$ of clock pulse $P_A$ pass through the AND gate 10 and in the case of the unit time period III the clock pulses $P_{7c}$ and $P_{8c}$ pass through the AND gate 10 as shown in FIG. 2F.

The clock pulses $P_F$ which are passed through the AND gate 10 are fed through an OR gate 11 to a shift register 12 which is formed of, for example, eight flip-flops. This shift register 12 is supplied with the clock pulse $P_A$ from the clock pulse generator 6, so that the clock pulses $P_{3a}, \ldots P_{8a}$ in the output $P_F$ are shifted to the shift register 12 by the clock pulses $P_{1a}, \ldots P_{8a}$ during the unit time period I. Then, the content of the shift register 12 is shifted in parallel to a latch circuit 13 by the strobe pulse $P_{S1}$ which is applied thereto from the ⅛ frequency divider 7.

The content of latch circuit 13 is indicated through a drive circuit 14 on an indicator device 15. This indicator device 15 is formed of eight indicating elements $S_1 \ldots S_8$ such as luminous diodes, liquid crystals or the like in correspondence with eight registers of shift register 12.

For example, these indicating elements $S_1$ to $S_8$ are arranged such that each element is in close contact with one another as shown in FIG. 3, and is lit when the corresponding latch output is "1".

That is, during the unit time period I, six pulses are fed to the shift register 12 and then latched, so that all of the elements $S_1$ to $S_6$ are lit in the unit time period, while in the period II four elements $S_1$ to $S_4$ are lit. Therefore, the level indication corresponds to the real-time instantaneous analog level or, in this example, is compressed and expanded with the left end element $S_1$ as a standard like a bar-graph. In other words, the level of the audio signal is displayed or indicated as a bar-graph. For example, the level indication of the audio signal in the period II would be as shown in FIG. 3, in which the hatched portions represent the elements which are lit. In this case, however, the element $S_6$ serves as an indication of the peak value, as will be described below.

Next, the indication for the maximum peak value of an audio signal will be explained. When the pulse signal $P_F$, which is an input to the shift register 12, is a pulse train such as shown in FIG. 2F, the serial output signal $P_H$ from the shift register 12 is not a pulse train but a binary signal which corresponds to the presence or absence of the pulse (refer to FIG. 2G) and the timing relation therebetween is shown in FIGS. 2F and 2G.

The serial output signal $P_H$ from the shift register 12 is applied to a detector circuit 20 so as to detect the maximum peak value of the pulse signal $P_F$ of the input audio signal. This detector circuit 20 includes a D-type flip-flop circuit 16 which is supplied at its D-terminal with the serial output signal $P_H$. Thus, if the clock pulse $P_A$ shown in FIG. 2A is applied from the clock pulse generator 6 to the flip-flop circuit 16 as its clock pulse, the flip-flop circuit 16 operates at a time delayed by just one bit, that is, delayed by one clock pulse, from the serial output signal $P_H$ and then produces an output signal $P_I$ shown in FIG. 2H. The output signal $P_I$ from the flip-flop circuit 16 and clock pulse $P_A$ from the clock pulse generator 6 are both applied to an AND-gate 17. Thus, the flip-flop circuit 16 and AND-gate 17 form, in essence, a logic differentiation circuit. A gated output $P_J$ (shown in FIG. 2I) from the AND-gate 17 is fed to an RS flip-flop circuit 18 as its set pulse. As the reset pulse for the flip-flop circuit 18, the aforesaid strobe pulse $P_{S2}$ is utilized. Accordingly, if the set and reset of the RS flip-flop circuit 18 are triggered at the negative-going edges of the pulses applied thereto, the flip-flop circuit 18 produces at its Q output terminal an output signal $P_K$ shown in FIG. 2J. The output signal $P_K$ from the flip-flop 18 and the output signal $P_I$ from the flip-flop circuit 16 are both fed to an AND-gate 19, which then produces a pulse signal $P_L$ shown in FIG. 2K when the reset pulse is "1". This pulse signal $P_L$ from the AND-gate 19 represents the maximum value of the peak values to be detected.

In fact, although the following pulses of signal $P_J$ are fed from the AND-gate 17 to the flip-flop circuit 18, it is not supplied with the reset pulse, so that the output at the Q-terminal of the flip-flop circuit 18 is "0". Accordingly, the output of the AND-gate 19 becomes "0". Thus, the flip-flop circuit 18 and AND gate 19 operate to produce only the first pulse but inhibit the passage of the following pulse, so that the flip-flop circuit 18 and AND gate 19 in essence act as an inhibit circuit.

The pulse $P_L$ representing the peak value is fed to an input of the OR gate 11 and then added therein to the pulse signal $P_F$ from the AND gate 10.

Now, a description will be given on the relationship between the peak-value pulse $P_L$ and the level indication with reference to FIG. 2F. If in the period I the input level is converted into six pulses and in the period II the input level is converted into four pulses, the peak value pulse $P_L$ added in the period II occurs at the position of the third pulse from the beginning of the period II (refer to the broken line in FIG. 2F) and the peak value pulse $P_L$ corresponds to the peak value in the level of the earlier period I. When the content in the period II is fed to the shift register 12, the peak value pulse $P_L$ corresponds to the sixth bit from the input side. Therefore, if the content in the period II is indicated, it becomes as shown in FIG. 3. That is, the peak value in the period I and the input level in the period II are simultaneously indicated on the element $S_6$ and $S_4$ corresponding to the respective levels thereof.

In the case of the period III, the serial output $P_H$ including the peak value pulse $P_L$ is obtained as the content of the shift register 12 in the period II, so that in the period III the peak value pulse $P_L$ is obtained again in the same fashion as during the period II and is so indicated. However, in the case that the level in the period III is greater than that of, the period I, since the first pulse of pulse train in the pulse signal $P_F$ occurs prior to the pulse $P_L$, that is, pulse signal $P_F$ occurs from the first clock pulse position during the period III, the first pulse of this pulse train indicates the peak value of the level in the period III and will represent the maximum value in periods subsequent to the period III.

Finally, the level presently indicated and the maximum peak value of the audio signal for periods up until the present period are indicated. After the maximum value is once indicated, in subsequent periods the instantaneous level of the audio signal will continue to be displayed.

Since the present invention is constructed as above, at every strobe pulse $P_S$ the content of the shift register 12 is moved or shifted to the latch circuit 13 and the content of the indication is changed. However, the pulse corresponding to the maximum value of the peaks is fed back as the series input of the shift register 12 and the pulses thereafter are inhibited by the RS flip-flop circuit, so that only the pulse $P_L$ representing the maximum peak value of the audio signal retained in the register 12 and this retained content is changed only when the maximum value increases.

Since with the present invention holding the maximum peak level is digitally carried out by the shift register 12 and ancillary circuitry, such holding of the maximum peak level can be achieved without requiring a high-value capacitor such that the circuit construction becomes simplified but holding the maximum peak level can be achieved accurately.

In the above example, the holding of the maximum peak level and the real-time instantaneous indication of the peak can be carried out by using only the hold capacitor 4, so that the position of the peak of the real time indication at the unit time when the peak becomes maximum coincides with the hold position of the maximum peak value.

Further, in this invention the time constant of the peak amplifier can be freely varied by changing the capacitance value of the hold capacitor 4, so that the recovery time in the case of the real time indication of the peak can be freely varied regardless of the maximum value indication of the peaks.

In addition, the circuit of the present invention can be easily made as an integrated circuit even in the case of a complementary MOS-type integrated circuit, and the number of the indication elements can be increased by connecting a number of peak hold circuits, each of which is made as an integrated circuit, in series with one another.

In the example of the invention shown and described above, its main part is formed of the shift register and latch circuit but it can be formed of the combination of a random access memory, a multiplexer and a latch circuit.

The above description is given on a single preferred embodiment of the present invention but it is apparent that many modifications and variations could be made by those skilled in the art without departing from the spirit or scope of the novel concepts of the invention, which is to be ascertained from the appended claims.

We claim as our invention:

1. Apparatus for indicating the level of an analog signal which is subject to variations in its amplitude comprising:
   first means for providing a train of pulses during a recurring time interval of predetermined period, with the number of pulses in said train corresponding to the level of said analog signal;
   second means for storing said train of pulses from said first means and providing an output corresponding to said stored train of pulses;
   third means connected to and responsive to said output of said second means for forming and regenerating a pulse whose position corresponds to the peak level of said analog signal during any preceding time interval;
   fourth means for feeding said pulse formed in said third means back to said second means and for combining said pulse with said train of pulses provided by said first means; and
   display means for displaying at least said peak level of said analog signal in response to said output from said second means.

2. Apparatus for indicating the level of an analog signal according to claim 1; wherein said third means includes means for differentiating logically the output of said second means and providing a pulse only in response to the first differentiated output occurring during one of said recurring time intervals, while inhibiting subsequent pulses during said interval.

3. Apparatus for indicating the level of an analog signal according to claim 1; wherein said first means includes means for generating clock pulses, said second means includes a shift register having a serial output, and said third means includes a first flip-flop which is supplied with said serial output from said shift register and with said clock pulses and a logic gate providing an output corresponding to the logic product of said clock pulses and the output of said flip-flop.

4. Apparatus for indicating the level of an analog signal according to claim 3; wherein said first means further includes means for providing a pulse at the end of each said time interval, and said third means further includes a second flip-flop which is supplied to said output from said logic gate and with said pulse at the end of each said time interval, and a circuit supplied with the output from said second flip-flop and the output from the first flip-flop to produce said one pulse whose position corresponds to said peak level.

5. Apparatus for indicating the level of an analog signal according to claim 1; wherein said first means includes means for generating clock pulses, a frequency-divider for frequency-dividing said clock pulses, integrating means for integrating the frequency-divided output from said frequency-divider, comparator means for comparing the integrated output from said integrating means with said analog signal, and AND means for providing said train of pulses in response to the output of said comparator means and said clock pulses.

6. Apparatus for indicating the level of an analog signal according to claim 5; wherein said fourth means includes logic OR means having inputs connected to the outputs of said AND means and said third means, respectively, and an output connected to said second means.

7. Apparatus for indicating the level of an analog signal according to claim 1; wherein said first means includes means for generating clock pulses, frequency-dividing means for frequency-dividing said clock pulses, integrating means for integrating the frequency-divided output of said frequency-dividing means, means supplied with said analog signal for holding the level of said analog signal, a comparator for comparing the held level of said analog signal with said integrated frequency-divided signal from said integrating means and providing an output and a gate circuit for providing said train of pulses in response to the output of said comparator and said clock pulses.

8. Apparatus for indicating the level of an analog signal according to claim 7; wherein said gate circuit provides said train of pulses as the logic product of the compared output from said comparator and said clock pulses.

9. Apparatus for indicating the level of an analog signal according to claim 1; wherein said display means displays said peak level of said analog signal and also displays the instantaneous level of said analog signal during the next previous time interval.

* * * * *